(12) United States Patent  
Card et al.

(10) Patent No.: US 8,719,761 B2
(45) Date of Patent: May 6, 2014

(54) METHOD AND APPARATUS FOR OPTIMIZING MEMORY-BUILT-IN-SELF TEST

(71) Applicants: Norman Card, Johnson City, NY (US); Puneet Arora, Noida (IN); Steven Gregor, Owego, NY (US); Navneet Kaushik, Padam Nagar (IN)

(72) Inventors: Norman Card, Johnson City, NY (US); Puneet Arora, Noida (IN); Steven Gregor, Owego, NY (US); Navneet Kaushik, Padam Nagar (IN)

(73) Assignee: Candence Design Systems, Inc., San Jose, CA (US)

( * ) Notice: Subject to any disclaimer, the term of this patent is extended or adjusted under 35 U.S.C. 154(b) by 4 days.

(21) Appl. No.: 13/625,682

(22) Filed: Sep. 24, 2012

(65) Prior Publication Data

US 2014/0089874 A1    Mar. 27, 2014

(51) Int. Cl.
  *G06F 17/50*  (2006.01)
(52) U.S. Cl.
  USPC ............ 716/136; 716/106; 716/111; 716/135
(58) Field of Classification Search
  None
  See application file for complete search history.

(56) References Cited

U.S. PATENT DOCUMENTS

| 6,775,811 | B2 * | 8/2004 | Lakshmanan et al. | 716/103 |
| 7,319,624 | B2 * | 1/2008 | Chang et al. | 365/201 |
| 7,853,905 | B1 * | 12/2010 | Cheong et al. | 716/136 |
| 7,926,012 | B1 * | 4/2011 | Parimi et al. | 716/106 |
| 2002/0194558 | A1 * | 12/2002 | Wang et al. | 714/718 |

* cited by examiner

*Primary Examiner* — Leigh Garbowski
(74) *Attorney, Agent, or Firm* — Dickstein Shapiro LLP

(57) ABSTRACT

Testing of memories is done using an optimized memory built-in-self-test (MBIST) approach, including the generation of compact models for memory. Cost functions are constructed from estimated parameters affecting MBIST, and a user is able to assign relative weights to the parameters. Estimated parameters include MBIST area, wiring congestion, and timing overhead, as well as power consumption and timing. The cost functions are minimized using optimization techniques, resulting in an optimized grouping of memory devices and an optimized schedule for MBIST testing. The estimated parameters may be derived from a compact model constructed from data experimentally-derived from various memory devices. This approach allows a circuit designer to generate and revise groupings and schedules prior to running a full design flow, saving time and cost, while still achieving high-quality results.

44 Claims, 5 Drawing Sheets

METHOD AND APPARATUS FOR OPTIMIZING MEMORY-BUILT-IN-SELF TEST

FIELD

The present patent document relates generally to design for test for integrated circuits. In particular, the present patent document relates to a method and apparatus for optimizing memory built-in-self-test (MBIST).

BACKGROUND

Built-in self-test (BIST) consists of circuits manufactured as part of an integrated circuit that enable the verification of some or all of the internal functionality of the integrated circuit. BIST has many benefits, including reducing the reliance on external test equipment, reducing the time required for test, improving the simplicity of the test interface, and reducing the number input/output pins required for test.

As more and more functionality gets integrated into system-on-chip (SoC) designs, there has been a steady increase in the amount of memory present on such chips. Observers in the semiconductor industry widely believe that this trend will continue. According to the International Technology Roadmap for Semiconductors, almost 90% of chip area is going to comprise various memories by 2014. Because manufacturing yield depends on the quality of test, the clear indication is that SoC manufacturing yield is going to be proportional to the quality of memory test, and in particular MBIST. Of course, this will be true for any chip having significant amounts of memory.

Memory typically has the highest transistor density of the components of a particular chip design. As a result, the power consumption can be very high while accessing memories during MBIST. If memory test power requirement are not incorporated into the design of the power grid of a chip, the heat generated during test may permanently damage the chip. For example if all the memories of a chip are tested in parallel, i.e. all memories are tested at nearly the same time, the power dissipation will be at a maximum, and the generated heat may well destroy the chip. To keep power dissipation under the damage limit during MBIST, memories may be tested serially, that is, each memory tested one at a time until all memories have been tested. Though the resultant heat dissipation will less, performing MBIST serially significantly increases the time required for testing, usually beyond acceptable limits. However, when it is not known in advance whether and how much of MBIST may be performed in parallel, performing such testing serially usually ensures that the chip will not overheat.

Extra hardware inserted on a chip for purposes of test is considered necessary, but otherwise undesirable, by a chip designer because it occupies valuable chip area. An increase in used chip area increases complexity, cost, and time to market of the chip. Moreover, as chip geometries and feature sizes continue to shrink and ever more functionality is integrated onto the chip, the number of wires required to connect the larger number of various circuits also increases. Thus, the test hardware is not only a concern from the area perspective, but also in terms of increased wire routing congestion on the chip. On top of area and congestion, because memories often need to be tested at or near their operation speed, timing is also an important consideration when designing MBIST hardware. MBIST hardware should be physically aware, so that the area overhead, wire routing congestion, and interconnect timing may be optimized.

Presently, there is no suitable technique that may be used to estimate the power, test time, area overhead, wire routing congestion, and interconnect timing for a chip designer, which estimates would allow the chip designer to minimize the test time and area overhead, while preventing excessive wiring congestion and chip damage from excessive power dissipation during MBIST. For example, power dissipation is influenced by many factors for each of the memories under test, including address size of the memory, data width of the memory, the size of the memory multiplexers, and the frequency at which the memory is being tested. In order to determine the power dissipation, presently, a chip designer needs to run an extensive flow of various CAD tools in the design environment. Similarly, the area overhead depends on a number of factors, including the number of controllers, number of devices being shared by a controller, the address width of the memory, and the data width of the memory. To determine the area overhead, the chip designer must insert MBIST hardware into the circuit design and synthesize the design to calculate the area overhead estimate. These approaches are time consuming, increasing cost and time to market.

SUMMARY

A method and apparatus for testing an integrated circuit design including a plurality of memory devices is disclosed.

According to an embodiment, a method of scheduling memory built-in-self-test (MBIST) for an integrated circuit having a plurality of memory devices is disclosed. The method comprises assigning a weight to each scheduling parameter of a plurality of scheduling parameters associated with MBIST circuitry; calculating an estimate for each scheduling parameter of the plurality of scheduling parameters using a compact model, wherein the compact model models a relationship between the plurality of scheduling parameters and a plurality of memory factors associated with each memory device of the plurality of memory devices, wherein the compact model is formulated from test data of a plurality of test memory devices, and wherein each memory device factor influences one or more scheduling parameters of the plurality of scheduling parameters; applying the weights to the plurality of estimated scheduling parameters; varying a schedule to generate a cost function that depends on the plurality of scheduling parameters, wherein the schedule defines the order for testing the plurality of memory devices during MBIST; and minimizing the cost function using an optimization technique to generate an optimized schedule for testing the plurality of memory devices during MBIST.

In another embodiment, one of the scheduling parameters of the plurality of scheduling parameters comprises a power consumption.

In another embodiment, one of the scheduling parameters of the plurality of scheduling parameters comprises a test run time.

In another embodiment, each of the first five steps are repeated, wherein a second weight is assigned to each scheduling parameter of the plurality of scheduling parameters, and wherein one or more second weights of the plurality of second weights are different from the weights previously assigned to the scheduling parameter during the first step.

In another embodiment, the steps are performed in seriatim.

In another embodiment there is the further step of normalizing each scheduling parameter of the plurality of scheduling parameters.

In another embodiment, normalizing each scheduling parameter comprises linearly interpolating each scheduling parameter to a scale of zero to one.

In another embodiment, the optimization technique comprises a simulated annealing method.

In another embodiment, the plurality of memory device factors comprise one or more of a memory device address size, a memory device data width, a memory device column multiplexer factor, a test frequency, a test algorithm factor, a count of memory devices shared by a MBIST controller, or a count of memory device ports.

According to an embodiment, a method of generating a compact model of power consumption during memory built-in-self-test (MBIST) is disclosed. The method comprises receiving an integrated circuit design, including a plurality of memory devices and associated MBIST circuitry, wherein a plurality of factors are associated with the plurality of memory devices, wherein each factor of the plurality of factors influence MBIST power consumption, and wherein each memory device has a certain value for each factor; generating a plurality of test vectors according to a MBIST algorithm; applying the plurality of test vectors to each memory device of the integrated circuit design; calculating a power consumption value for each memory device based on the applied test vectors; storing the power consumption value and the plurality of factor values in a database in a computer memory for each memory device; and formulating a compact model modeling a relationship between the power consumption and the plurality of factors from the plurality of power consumption values and the plurality of factor values.

In another embodiment, the plurality of factors comprise one or more of a memory device address size, a memory device data width, a memory device column multiplexer factor, a test frequency, a test algorithm factor, a count of memory devices shared by a MBIST controller, or a count of memory device ports.

In another embodiment, the MBIST algorithm comprises one or more of a march LR algorithm, a checkerboard algorithm, a wordline stripe algorithm, a galloping ones algorithm, a pseudo-random address algorithm, or a port interaction algorithm.

In another embodiment, the compact model is a linear equation.

According to an embodiment, a computer-readable non-transitory storage medium having stored thereon a plurality of instructions is disclosed. The plurality of instructions, when executed by a computer, cause the computer to perform: assigning a weight to each scheduling parameter of a plurality of scheduling parameters associated with MBIST circuitry; calculating an estimate for each scheduling parameter from a database of experimentally-determined relationships between a plurality of memory device factors and the plurality of scheduling parameters, wherein each memory device factor influences one or more scheduling parameters; applying the weights to the plurality of scheduling parameters; varying a schedule to generate a cost function that depends on the plurality of scheduling parameters, wherein the schedule defines the order for testing the plurality of memory devices during MBIST; and minimizing the cost function using an optimization technique to generate an optimized schedule for testing the plurality of memory devices during MBIST.

In another embodiment, the plurality of scheduling parameters comprises a power consumption.

In another embodiment, the plurality of scheduling parameters comprise a power consumption and a test run time.

In another embodiment, the plurality of instructions when executed by a computer, cause the computer to further perform: repeating each of the first five steps, wherein a second weight is assigned to each scheduling parameter of the plurality of scheduling parameters, and wherein one or more second weights assigned to a scheduling parameter of the plurality of scheduling parameters are different from the weights previously assigned to the scheduling parameter during the first step.

In another embodiment, the steps are performed in seriatim.

In another embodiment, the plurality of instructions when executed by a computer, cause the computer to further perform normalizing each scheduling parameter of the plurality of scheduling parameters.

In another embodiment, normalizing each scheduling parameter comprises linearly interpolating each scheduling parameter to a scale of zero to one.

In another embodiment, the optimization technique comprises a simulated annealing method.

In another embodiment, the plurality of memory device factors comprise one or more of a memory device address size, a memory device data width, a memory device column multiplexer factor, a test frequency, a test algorithm factor, a count of memory devices shared by a MBIST controller, or a count of memory device ports.

According to an embodiment, a computer-readable non-transitory storage medium having stored thereon a plurality of instructions is disclosed. The plurality of instructions when executed by a computer, cause the computer to perform: providing a plurality of memory devices and associated MBIST circuitry, wherein a plurality of factors are associated with the plurality of memory devices, and wherein each factor of the plurality of factors influence MBIST power consumption; generating a plurality of test vectors according to a MBIST algorithm; calculating a power consumption value for each memory device having a plurality of factors, wherein the plurality of test vectors are applied to each memory device to produce a power consumption value; compiling the plurality of power consumption values and the plurality of factors into a database in a computer memory; and calculating a compact model defining a relationship between a power consumption and the plurality of factors.

In another embodiment, the plurality of factors comprise one or more of a memory device address size, a memory device data width, a memory device column multiplexer factor, a test frequency, a test algorithm factor, a count of memory devices shared by a MBIST controller, or a count of memory device ports.

In another embodiment, the MBIST algorithm comprises one or more of a march LR algorithm, a checkerboard algorithm, a wordline stripe algorithm, a galloping ones algorithm, a pseudo-random address algorithm, or a port interaction algorithm.

In another embodiment, the compact model is a linear equation.

According to an embodiment, a method of generating memory built-in-self-test (MBIST) circuitry to be disposed on an integrated circuit is disclosed. The method comprising: receiving an integrated circuit design having a plurality of memory devices, wherein a plurality of memory factors are associated with each memory device; selecting a weight for each grouping parameter of a plurality of grouping parameters associated with MBIST circuitry; calculating an estimate for each grouping parameter of the plurality of grouping parameters using a compact model, wherein the compact model models a relationship between the plurality of grouping parameters and the plurality of memory factors, and wherein the compact model is formulated from test data of a plurality of test memory devices; applying the weights to each estimated grouping parameter to create a cost function comprising a sum of weighted grouping parameters; minimizing the cost function using an optimization technique; generating an optimized grouping of MBIST circuitry based on the minimized cost function; and inserting MBIST circuitry into the integrated circuit design according to the optimized grouping.

In another embodiment, one of the grouping parameters of the plurality of grouping parameters comprises an area overhead.

In another embodiment, one of the grouping parameters of the plurality of grouping parameters comprises a wiring congestion overhead.

In another embodiment, one of the grouping parameters of the plurality of grouping parameters comprises a timing overhead.

In another embodiment, each of the second through sixth steps are repeated, wherein a second weight is assigned to each grouping parameter of the plurality of grouping parameters, and wherein one or more second weights assigned to the grouping parameter of the plurality of grouping parameters are different from the weights previously assigned to the grouping parameter during the second step.

In another embodiment, each of the steps are performed in seriatim.

In another embodiment, the method further comprises normalizing each grouping parameter of the plurality of grouping parameters.

In another embodiment, normalizing each grouping parameter comprises linearly interpolating each grouping parameter to a scale of zero to one.

In another embodiment, the optimization technique comprises a simulated annealing method.

In another embodiment, the plurality of grouping factors comprise one or more of a MBIST controller count, a count of memory devices shared by each MBIST controller, a memory device address width, and a memory device data width.

According to an embodiment a method of generating memory built-in-self-test (MBIST) circuitry to be disposed on an integrated circuit is disclosed. The method comprises receiving an integrated circuit design having a plurality of memory devices, wherein a plurality of memory factors are associated with each memory device; selecting a weight for each grouping parameter of a plurality of grouping parameters associated with MBIST circuitry; retrieving from a database a set of test data for a plurality of test memory devices, wherein the test data includes a plurality of grouping parameter test values and a plurality of memory factor test values; formulating a compact model modeling the relationship between the plurality of grouping parameters and the plurality of memory factors based on the set of test data; calculating an estimate for each grouping parameter of the plurality of grouping parameters using the compact model; applying the weights to each estimated grouping parameter to create a cost function comprising a sum of weighted grouping parameters; minimizing the cost function using an optimization technique; generating an optimized grouping of MBIST circuitry based on the minimized cost function; and inserting MBIST circuitry into the integrated circuit design according to the optimized grouping.

In another embodiment, the plurality of grouping parameters comprise an area overhead, a timing overhead, and a wiring congestion overhead.

In another embodiment, the method further comprises normalizing each grouping parameter of the plurality of grouping parameters.

In another embodiment, normalizing each grouping parameter comprises linearly interpolating each grouping parameter to a scale of zero to one.

In another embodiment, the optimization technique comprises a simulated annealing method.

In another embodiment, the plurality of grouping factors comprise one or more of a MBIST controller count, a count of memory devices shared by each MBIST controller, a memory device address width, and a memory device data width.

According to an embodiment, a method of generating a compact model of area overhead for memory built-in-self-test (MBIST) is disclosed. The method comprises: receiving an integrated circuit design having a plurality of memory devices, wherein a plurality of factors affecting an area overhead are associated with each memory device; inserting MBIST circuitry for the plurality of memory devices into the integrated circuit design, wherein a plurality of area parameters are associated with the MBIST circuitry, and wherein the plurality of area parameters depend on the plurality of factors affecting the area overhead; calculating a value for each area parameter of the plurality of area parameters by varying the value of one or more factors of the plurality of factors; storing the plurality of area parameter values and the plurality of factor values in a database in a computer memory; and formulating a compact model modeling a relationship between the area overhead and the plurality of factors from the plurality of area parameter values and the plurality of factor values.

In another embodiment, the area parameters of the plurality of area parameters comprise a controller area overhead.

In another embodiment, one of the area parameters of the plurality of area parameters comprises a comparator area overhead.

In another embodiment, one of area parameters of the plurality of area parameters comprises a multiplexer area overhead.

In another embodiment, the plurality of factors comprise one or more of a MBIST controller count, a count of memory devices shared by each MBIST controller, a memory device address width, and a memory device data width.

In another embodiment, the compact model is a linear equation.

According to an embodiment, a computer-readable non-transitory storage medium having stored thereon a plurality of instructions is disclosed. The plurality of instructions, when executed by a computer, cause the computer to perform: receiving an integrated circuit design having a plurality of memory devices, wherein a plurality of memory factors are associated with each memory device; selecting a weight for each grouping parameter of a plurality of grouping parameters associated with MBIST circuitry; calculating an estimate for each grouping parameter of the plurality of grouping parameters using a compact model, wherein the compact model models a relationship between the plurality of grouping parameters and the plurality of memory factors, and wherein the compact model is formulated from test data of a plurality of test memory devices; applying the weights to each estimated grouping parameter to create a cost function comprising a sum of weighted grouping parameters; minimizing the cost function using an optimization technique; generating an optimized grouping of MBIST circuitry based on the minimized cost function; and inserting MBIST circuitry into the integrated circuit design according to the optimized grouping.

In another embodiment, one of the grouping parameters of the plurality of grouping parameters comprises an area overhead.

In another embodiment, one of the grouping parameters of the plurality of grouping parameters comprises a wiring congestion overhead.

In another embodiment, one of the grouping parameters of the plurality of grouping parameters comprises a timing overhead.

In another embodiment, the plurality of instructions when executed by a computer, cause the computer to further perform repeating each of the second through sixth steps, wherein a second weight is assigned to each grouping parameter of the plurality of grouping parameters, and wherein one or more second weights assigned to the grouping parameter of the plurality of grouping parameters are different from the weights previously assigned to the grouping parameter during the second step.

In another embodiment, the steps are performed in seriatim.

According to an embodiment, the plurality of instructions when executed by a computer, cause the computer to further perform normalizing each grouping parameter of the plurality of grouping parameters.

In another embodiment, normalizing each grouping parameter comprises linearly interpolating each grouping parameter to a scale of zero to one.

In another embodiment, the optimization technique comprises a simulated annealing method.

In another embodiment, the plurality of grouping factors comprise one or more of a MBIST controller count, a count of memory devices shared by each MBIST controller, a memory device address width, and a memory device data width.

According to an embodiment, the plurality of instructions when executed by a computer, cause the computer to perform: receiving an integrated circuit design having a plurality of memory devices, wherein a plurality of memory factors are associated with each memory device; selecting a weight for each grouping parameter of a plurality of grouping parameters associated with MBIST circuitry; retrieving from a database a set of test data for a plurality of test memory devices, wherein the test data includes a plurality of grouping parameter test values and a plurality of memory factor test values; formulating a compact model modeling the relationship between the plurality of grouping parameters and the plurality of memory factors based on the set of test data; calculating an estimate for each grouping parameter of the plurality of grouping parameters using the compact model; applying the weights to each estimated grouping parameter to create a cost function comprising a sum of weighted grouping parameters; minimizing the cost function using an optimization technique; generating an optimized grouping of MBIST circuitry based on the minimized cost function; and inserting MBIST circuitry into the integrated circuit design according to the optimized grouping.

In another embodiment, the plurality of grouping parameters comprise an area overhead, a wiring congestion overhead, and a timing overhead.

In another embodiment, the plurality of instructions when executed by a computer, cause the computer to further perform normalizing each grouping parameter of the plurality of grouping parameters.

In another embodiment, normalizing each grouping parameter comprises linearly interpolating each grouping parameter to a scale of zero to one.

In another embodiment, the optimization technique comprises a simulated annealing method.

In another embodiment, the plurality of grouping factors comprise one or more of a MBIST controller count, a count of memory devices shared by each MBIST controller, a memory device address width, and a memory device data width.

According to an embodiment, the plurality of instructions when executed by a computer, cause the computer to perform: receiving an integrated circuit design having a plurality of memory devices, wherein a plurality of factors affecting an area overhead are associated with each memory device; inserting MBIST circuitry for the plurality of memory devices into the integrated circuit design, wherein a plurality of area parameters are associated with the MBIST circuitry, and wherein the plurality of area parameters depend on the plurality of factors affecting the area overhead; calculating a value for each area parameter of the plurality of area parameters by varying the value of one or more factors of the plurality of factors; storing the plurality of area parameter values and the plurality of factor values in a database in a computer memory; and formulating a compact model modeling a relationship between the area overhead and the plurality of factors from the plurality of area parameter values and the plurality of factor values.

In another embodiment, one of the area parameters of the plurality of area parameters comprises a controller area overhead.

In another embodiment, one of the area parameters of the plurality of area parameters comprises a comparator area overhead.

In another embodiment, one of the area parameters of the plurality of area parameters comprises a multiplexer area overhead.

In another embodiment, the plurality of factors comprise one or more of a MBIST controller count, a count of memory devices shared by each MBIST controller, a memory device address width, and a memory device data width.

In another embodiment, the compact model is a linear equation.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
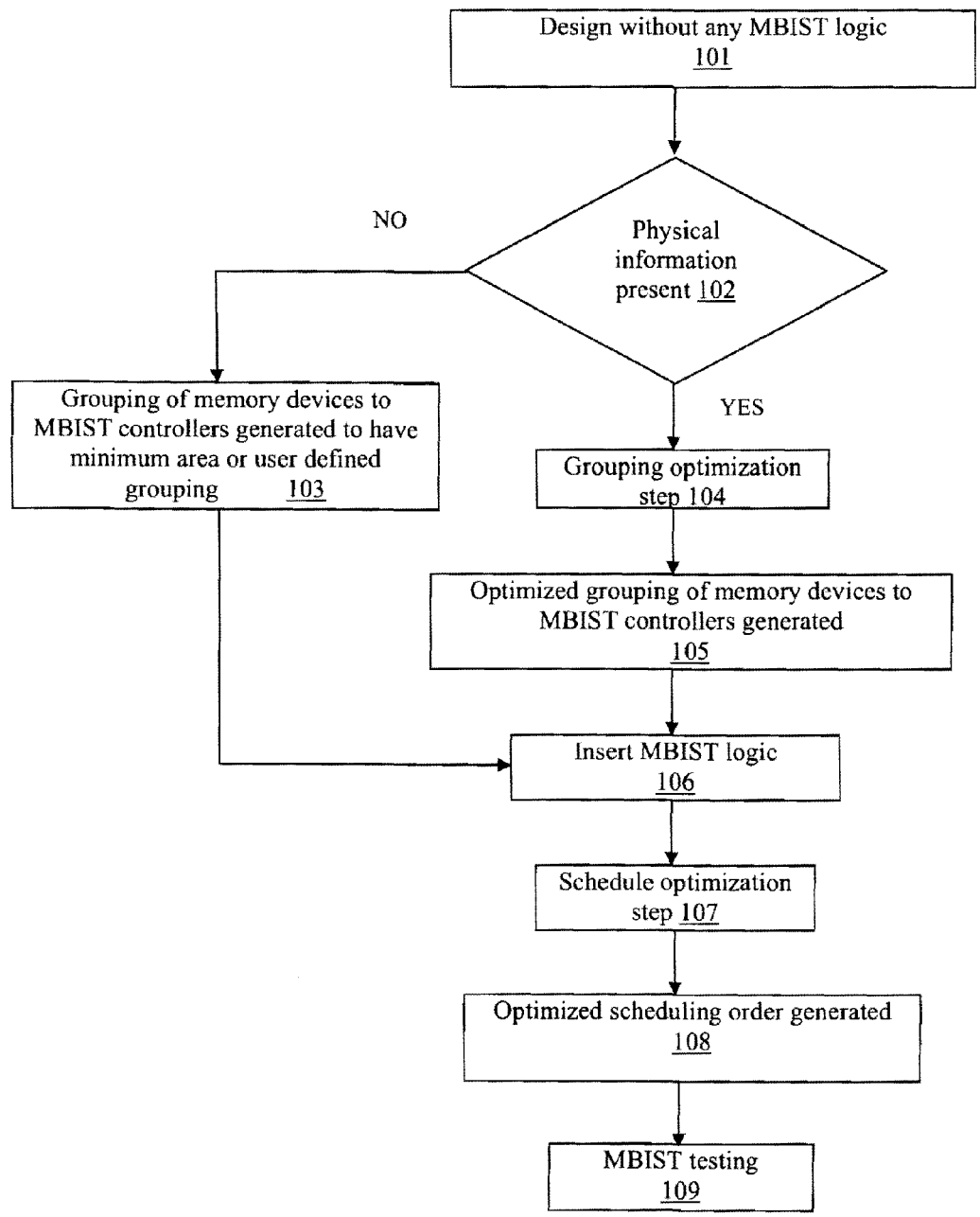
FIG. 1 illustrates an exemplary flow for optimized MBIST testing of an integrated circuit design.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for optimizing memory-built-in-self-test is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Integrated circuit designs, especially SoC designs, often contain numerous memories, including DRAM, SRAM, ROM, EEPROM, flash-based memory, or any other memory capable of incorporation into a SoC. In the memory built-in-self-test (MBIST) approach, each memory of an integrated circuit design is tested using any number of standard or user-defined algorithms, controlled by a MBIST controller that controls the application of test patterns, generated according to the algorithms, to the memories of the integrated circuit design. Each memory subject to MBIST requires at least one MBIST controller be assigned to it, and a single MBIST controller may, and usually does, control multiple memories. In addition to the MBIST control, other collar circuitry is needed to apply the test patterns to the memory devices. This circuitry includes multiplexers and comparators that are inserted around the memory to route MBIST signals to and from the memory devices under test. This circuitry requires additional area on the integrated circuit.

With shrinking technology and more on-chip logic, it is increasingly important to optimize all of the extra hardware required for performing design for test so that the area used is minimized. In addition to area, other testing parameters may be optimized: power consumption, wiring congestion, timing, and test-time. FIG. 1 illustrates a flow diagram to optimize MBIST according to an embodiment, including optimization of these parameters.

At step 101, an integrated circuit design is selected by the user, which circuit design does not yet have any MBIST logic associated with it. Such an integrated circuit design may made up of any number of hardware blocks, including processor cores, controllers, memory, peripherals, digital and analog interfaces, and power regulation and management circuits. The integrated circuit design may be in any suitable format, such as VHDL. At step 102, the flow proceeds depending on what physical information about the integrated circuit design is present, that is, whether the various hardware blocks and their associated memories have been laid out such that their physical relationship has been defined and is known.

If no such physical information is present, the flow proceeds to step 103. At step 103, either the user defines the grouping of memory devices to MBIST controllers, or, grouping is generated to have a minimum area overhead, which means that all memory devices share a single MBIST controller.

If the physical information is present, the flow proceeds to grouping optimization step 104, which optimizes the parameters of wiring congestion overhead, timing overhead, and area overhead for the MBIST hardware, including MBIST controllers. Each of these three parameters are physical in nature, and depend on the physical proximity of the memory devices, MBIST controllers, and any other MBIST hardware inserted in the integrated circuit device to enable MBIST.

The exact amount of hardware inserted in the circuit design depends at least in part on the degree of sharing between memory devices and MBIST controllers. Where each MBIST controller is associated with a greater number of memory devices, less chip area is taken up by MBIST controllers. While area overhead may be less in this circumstance, the length of the wires between each MBIST controller and its associated memory devices will be longer. Longer wires increase wiring congestion overhead, increasing interconnect complexity and making routing more difficult. Likewise, because longer wires have greater signal delay that must be taken into account in the design process, fewer numbers of MBIST controllers may adversely impact timing closure, which increases timing overhead. Decreasing the numbers of memory devices shared by each MBIST controller help to shorten wire lengths and aid in timing closure, but each MBIST controller uses further chip area. In short, each of the wiring congestion, timing, and chip area overhead parameters directly relate to and impact the physical information of the design.

The estimate for the area overhead parameter for a particular circuit design is calculated based on experimental data. First, experimental data is generated by varying a number of factors: word width of the memory devices; address size of the memory devices; type of memory device, including the number of ports and whether there are separate test ports; and amount of sharing between the controller and memory device. Second, a database containing the experimental results is created. Third, curve fitting of the experimental results is performed to generate formal relationships in the form of equation for the area variation against the various factors. Using these equations, it is possible to estimate the area overhead for MBIST controllers before MBIST logic is inserted into the integrated circuit design. This area estimation can then be used as part of the cost function optimization further detailed below.

The estimate for the wiring congestion overhead parameter is calculated based on the total wire-lengths for all the wires between and among the collar logic and memory devices. Routing algorithms that are available as part of commercial synthesis engines are used to route the wires and calculate estimated lengths for each wire. The collar logic may include MBIST controllers, comparators, multiplexers, and any other various logic used during MBIST that are associated with a particular memory device. For purposes of this wiring congestion overhead estimate, each MBIST controller is assumed to be at the centroid of the memory devices that share that particular controller. If the centroid is a blocked area of the chip, then a nearby non-blocked area in an arbitrary direction is found for placement of the controller. The location of the comparator is varied from close to the controller to close to the memory device, and wire-lengths are calculated at the different positions. The position that offers minimum wire-length is chosen. The wire-length estimation is blockage aware, meaning that the wires are routed around blockages during length estimation. This is possible with routing algorithms available in commercial circuit synthesis engines.

The timing overhead estimate is calculated based on the length of the wires. The delay per unit length of the wire must first be determined. This will be a known value dependent on the chip's process technology. Next, the delay of the complete wire is calculated from the delay per unit length and the length of the wire, as previously determined during the wiring congestion overhead estimation. The calculated delay is then compared against the clock frequency to determine whether pipeline stages on the wire are necessary to address signal delay. The area for each pipeline stage for each wire is then factored into the total estimated area overhead.

To achieve the optimum value for these three parameters—area overhead, wiring congestion overhead, and timing overhead—the problem is treated as an optimization problem having an associated cost function. The objective of the optimization process is to minimize the cost function. This cost function can be expressed by the following equation:

$$w_a*(\text{normalized area overhead})+w_c*(\text{normalized congestion overhead})+w_t*(\text{normalized timing overhead})$$

In this equation $w_a$ is the weight assigned by the user to the area overhead, in the range of zero to one. Similarly, the user-assigned weight for the wiring congestion overhead, $w_c$, is assigned to be in the range of zero to one, and the user-assigned weight for the timing overhead, $w_t$, is assigned to be in the range zero to one. The three weights are constrained such that they must all sum to the value one, that is, the following equation should also be satisfied:

$$w_a+w_c+w_t=1$$

Of course, it is not necessary that the weights be on a scale of zero to one, and sum to one. These values are chosen for convenience and ease of understanding. The weights may be constrained along any other suitable continuum, for example zero to two hundred fifty-six, so long as the relative weights may be assigned by the user and understood.

Since each of the cost parameters (area overhead, congestion overhead, and timing overhead) are determined according to different scales, for example square microns for area and nanoseconds for timing, a parameter's value may be much higher than the other, skewing the results. In order to optimize the cost function properly, normalized values of these parameters are used so that the parameters can be meaningfully compared. In order to normalize the cost parameter values, minimum and maximum values are calculated.

The area overhead will be minimal when all the memories share a single controller, and the area overhead will be maximal when all the memory devices are allocated to separate controllers. Assuming the minimum value as zero and maximum value as one hundred, the area overhead of any particular grouping of memory devices to MBIST controllers (while optimizing the cost function) is mapped between zero and one hundred using interpolation.

Similarly, wiring congestion overhead is minimized when each memory device is allocated to a separate MBIST controller, and maximized when every memory device is allocated to a single shared controller. Assuming the same minimum value of zero and maximum value of one hundred as the area overhead, the wiring congestion overhead for any particular grouping of memory devices to MBIST controllers is mapped between zero and one hundred using interpolation.

Timing overhead is likewise minimized when each memory device is allocated to a separate MBIST controller because each memory device will be near a controller, and maximized when every memory device is allocated to a single shared controller. The timing overhead for any particular grouping of memory devices to MBIST controllers is mapped between zero and one hundred using interpolation.

The simulated annealing method is a well-known metaheuristic used to locate global optimum solutions to functions. Having assigned weights to each of the parameters, and having normalized them, the cost function is optimized using the simulated annealing method at step 105. The cost function is optimized until a reasonably good approximation of the optimum is obtained or the computation time exhausts some fixed computation budget. After optimization, a report is generated detailing resultant optimized values and a grouping table assigning memory devices to certain controller engines. The adequacy of the approximation and the computation budget are determined in advance by the user. The simulated annealing method is described here, but the cost function may be optimized using one of any number of suitable optimization techniques.

At step 106, the optimized MBIST logic is inserted into the design if physical information was present at step 102. If no physical information was present at step 102, MBIST logic is inserted based on the area optimized or user defined grouping of memory devices.

The flow then proceeds to schedule optimization step 107, which optimizes the parameters of power consumption and test time. These parameters of the MBIST depend upon the order, or schedule, in which MBIST is run. If all memories are tested serially, then the power consumption is minimal, but the test time is maximal. On the other hand, if all memories are tested in parallel, then the test time will be minimal, but the power consumption will be maximal. Step 107 creates an optimized MBIST schedule that balances power consumption and test time. The schedule specifies which memories are tested in parallel and which are tested in series to each other.

The estimate for power consumption and test time for a particular circuit design is calculated based on experimental data. Note that MBIST logic has already been inserted in the circuit design at this point, and estimation of the power consumption and test time values for MBIST logic takes into account the complete design that includes both the circuit design itself and MBIST logic and related circuitry.

In order to estimate the power consumption, experimental data is first generated by varying a number of factors that affect the power consumption, including the following seven factors: the address size of the memory devices, the data width of the memory devices, the multiplexer size of the memory devices, the frequency at which the memory devices are tested, the MBIST algorithms being executed by the memory devices, the amount of sharing of controllers by the memory devices (i.e. the number of memory devices controlled by each controller), and the number of ports of the memory devices. The MBIST algorithms include any number of test algorithms commonly used to test memory devices, including march LR, checkerboard, wordline stripe, galloping ones, pseudo-random address, port interaction, or any other such algorithm or its variations. After varying the data, a database of the results is created. From this database, formal relationships for power variation are generated by curve-fitting the experimental data of the database. Such formal relationships comprise equations or formulas that represent the relationships among the various above-recited factors affecting power consumption. From these equations, it is now possible to estimate the power consumption for a given MBIST schedule, thus allowing to estimate power for various schedules for a particular circuit design prior to proceeding through the entire test flow.

In order to calculate the MBIST run time, a complete analysis of the MBIST logic and associated devices is done. The factors affecting test time are somewhat different than those affecting power consumption. As with power consumption, the factors include the following three: the address size of the memory devices, the data width of the memory devices, and the number of ports of the memory devices. At least an additional four factors affect MBIST run time: the address size of the MBIST engine, schedule/groupings used (serial, parallel, or a combination of serial and parallel), the clock frequency, and the MBIST algorithms used. The particular MBIST algorithm used affects the total MBIST run time because MBIST algorithms having greater complexity generally require a greater run time than simpler MBIST algorithms. Likewise, if greater numbers of MBIST algorithms are run, run time will increase. The exact number of clock cycles is determined for a given MBIST schedule without using a complete design flow.

In order to achieve a schedule optimizing power consumption and run time, the problem is treated as an optimization problem having an associated cost function that is solved using the simulated annealing method. This cost function can be expressed by the following equation:

$$w_p * (\text{normalized power consumption}) + w_r * (\text{normalized test run time})$$

In this equation $w_p$ is the weight assigned by the user to the power consumption, in the range of zero to one. Similarly, the user-assigned weight for the normalized test run time, $w_r$, is assigned to be in the range of zero to one. The two weights are constrained such that they must all sum to the value one, that is, the following equation is satisfied:

$$w_p + w_r = 1$$

Of course, it is not necessary that the weights be on a scale of zero to one, and sum to one. These values are chosen for convenience and ease of understanding. The weights may be constrained along any other suitable continuum, for example zero to two hundred fifty-six, so long as the relative weights may be assigned and understood by the user.

As with the area overhead, congestion overhead, and timing overhead parameters discussed above, the power consumption and run time are determined according to different scales. Thus, the values are normalized based on calculated minimum and maximum values for the parameters.

The power consumption is maximized when the memory devices are all run in parallel, and minimized when the memory devices are all run in series. The run time is maximized when the memory devices are all run in series, and minimized when they are run in parallel. Based on these calculated minimum and maximum values, the parameters may then be mapped to the same scale, for example one to one hundred, using known interpolation techniques.

Having normalized the parameters, at step 108 an optimized MBIST schedule is generated. The cost function for the power consumption and run time is minimized using simulated annealing or another suitable optimization technique, resulting in an optimized MBIST schedule. MBIST testing is then run according to the optimized MBIST schedule at step 109.

Further, an advantage of the described two-step optimization process—wherein the grouping optimization step 104 and schedule optimization step 107 are performed at different times—is that the steps are independent of each other.

Figure 2:
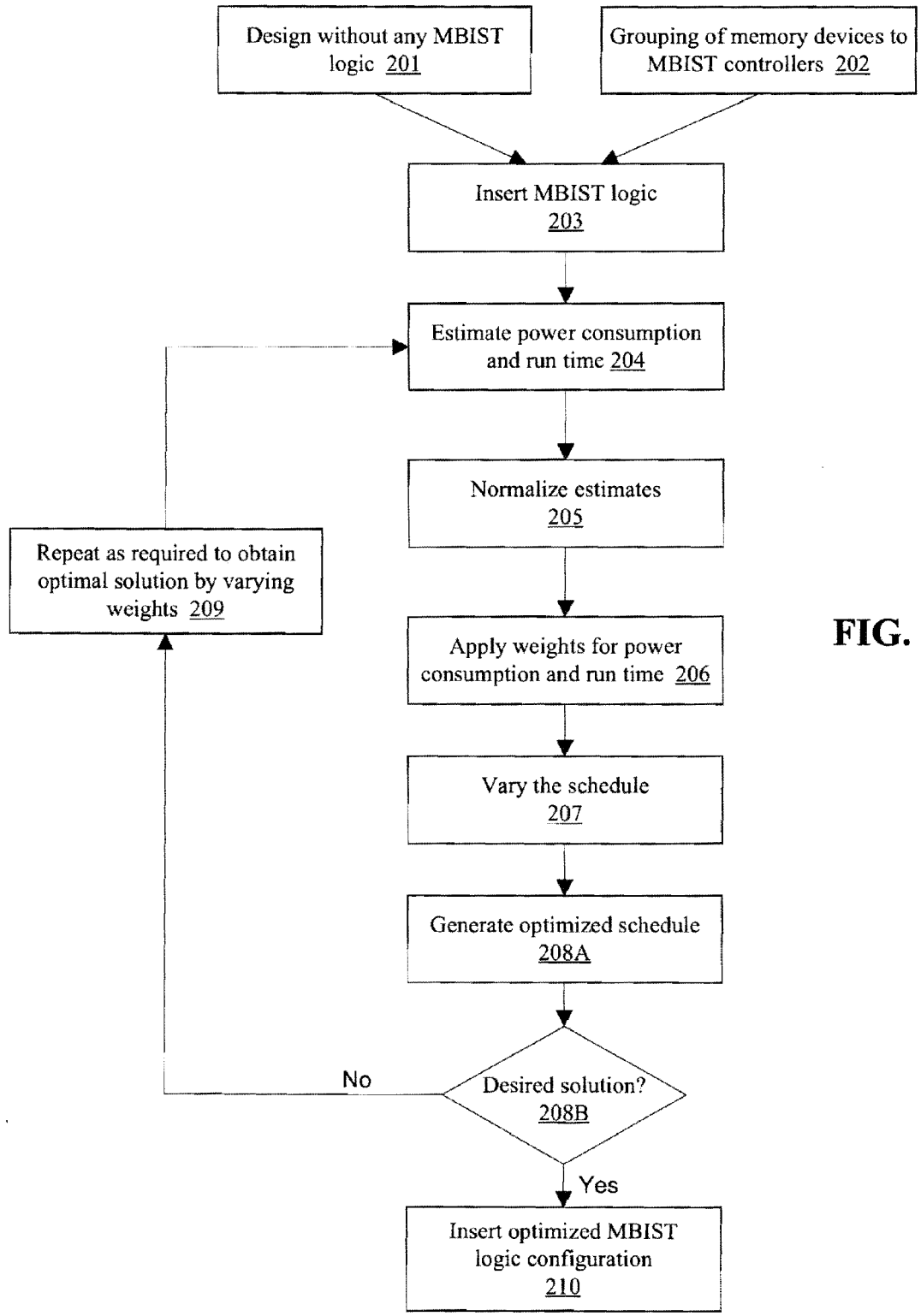
FIG. 2 illustrates an exemplary flow to optimize an MBIST schedule.

In another embodiment, the scheduling order for performing MBIST is optimized, independent of optimization of the grouping of memory devices. FIG. 2 illustrates a flow diagram to optimize an MBIST schedule according to an embodiment. First, an integrated circuit design is selected by the user, the circuit design not yet having MBIST logic. Grouping 202 represents a grouping of memory devices to an associated MBIST controller, wherein each MBIST controller is grouped with, and controls, one or more memory devices. Using the grouping information 202, MBIST logic and related circuitry are inserted into the integrated circuit design 201 at insertion step 203. At step 203, the user assigns a weight that applies to the power consumption estimate and a weight that applies to the run time estimate, indicating the relative importance to the user of power consumption minimization or run time minimization. These weights must sum to a certain fixed value. Alternatively, the user may assign the weights at step 209.

At step 204 the MBIST power consumption and MBIST run time for a particular schedule are estimated from a database containing experimentally-determined formal relationships. For the estimation, the particular factors for each memory device of the integrated circuit design that are relevant to power consumption and run time are compared against the database containing information for the factors for various memory devices. So that the estimated value for the power consumption parameter can be compared against the exact value for the run time parameter, the values are normalized to a common scale at step 205, for example the scale of zero as a minimum value to one as a maximum value, or for example the scale of zero as a minimum value to one hundred as a maximum value. At step 206, the user-supplied weights are applied to the power consumption estimate and the run time. At step 207, the schedule is varied, and steps 204 to 206 are repeated for the various schedules. The cost function is minimized using a simulated annealing method, or other comparable optimization technique. As a result of the optimization, an optimized schedule for running MBIST is generated at 208.

Further details of the MBIST power consumption and MBIST run time calculations and optimization of steps 204-208 are described in connection with step 107 of FIG. 1 above.

In another embodiment, steps 204-208 may be repeated as often as desired by the user if the generated optimized schedule is not as desired by the user. The user would return to step 204 (steps 201-203 would not need to be repeated), and assign different weights to the power consumption and run time. Steps 204-207 would then be repeated using the new weights and a new optimized schedule generated at step 208.

At step 209, the user assigns a weight that applies to the power consumption estimate and a weight that applies to the run time estimate, indicating the relative importance to the user of power consumption minimization or run time minimization. These weights must sum to a certain fixed value.

Figure 3:
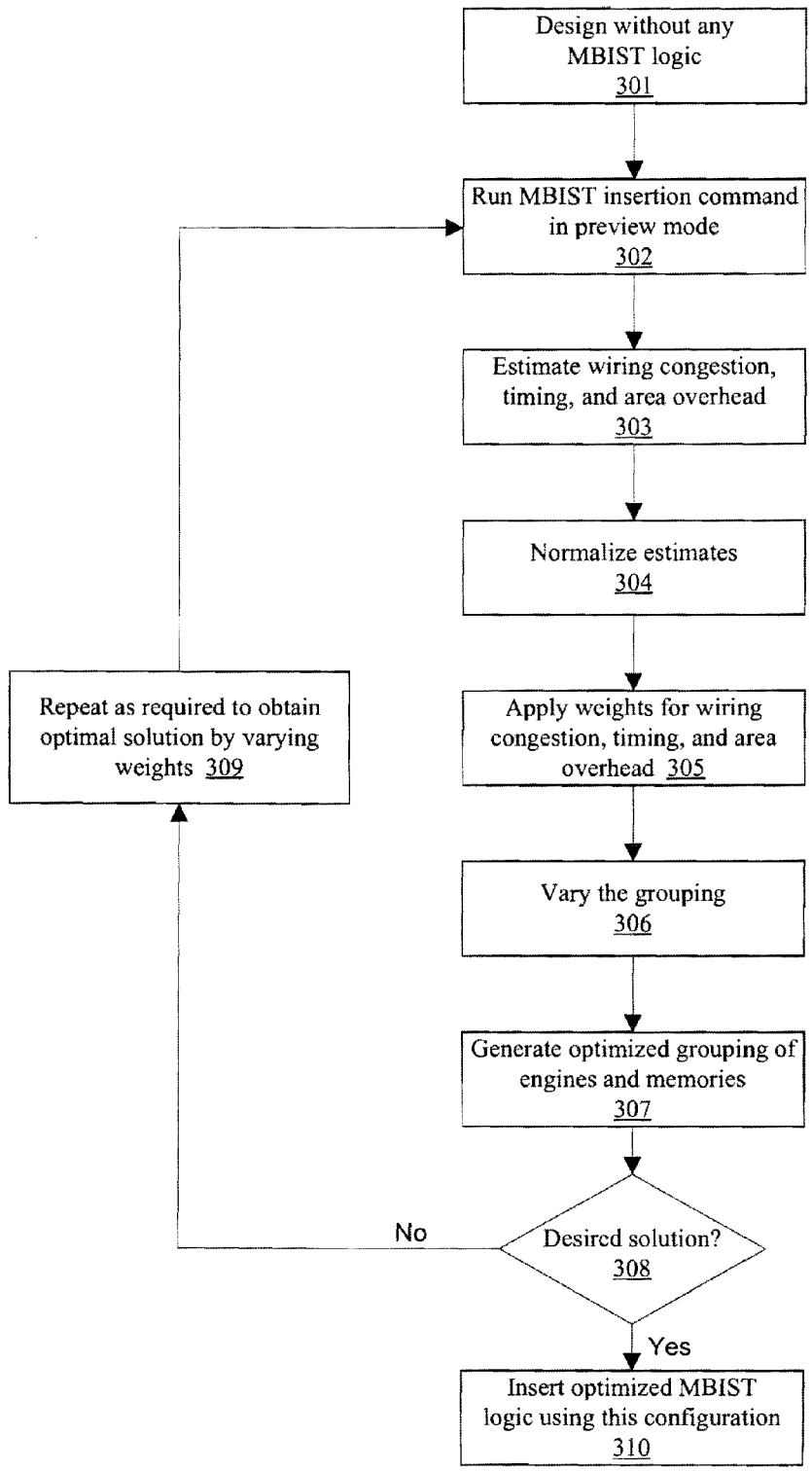
FIG. 3 illustrates an exemplary flow to optimize memory groupings in MBIST.

In another embodiment, the grouping of memory devices to MBIST controllers is optimized, independent of schedule optimization. FIG. 3 illustrates a flow diagram to optimize memory groupings in MBIST according to an embodiment. At step 301, an integrated circuit design is selected by the user, the circuit design not yet having any MBIST logic. At step 302, MBIST logic insertion command is run in a preview mode, meaning that no actual MBIST logic is inserted into the circuit design, but the MBIST logic may be analyzed and optimized prior to actual insertion. The user also assigns a weight that applies to the wiring congestion overhead estimate, a weight that applies to the timing overhead estimate, and a weight that applies to the area overhead estimate, indicating the relative importance to the user of power consumption minimization or run time minimization, such that the weights sum to a fixed value.

At step 303 the wiring congestion, timing, and area overheads for a particular grouping of memory devices to MBIST controllers are estimated from a database containing experimentally-determined formal relationships. For the estimation, the particular factors for each memory device of the integrated circuit design that are relevant to the wiring congestion, timing, and area overheads are compared against the database containing information for the factors for various memory devices. So that the estimated value for the wiring congestion overhead parameter can be compared against the estimated value for the timing overhead parameter, and can be further compared against the estimated value for the area overhead parameter, the values are normalized to a common scale at step 304, for example the scale of zero as a minimum value to one as a maximum value, or for example the scale of zero as a minimum value to one-hundred as a maximum value. At step 305, the user-supplied weights are applied to the wiring congestion overhead estimate, timing overhead estimate, and area overhead estimate. At step 306, the estimated wiring congestion, timing, and area overheads for the various groupings of memory devices to MBIST controllers, together with the assigned weights, are applied to a cost function and the cost function is evaluated. At step 306, the grouping is varied and steps 303-305 are repeated for the various groupings. The cost function is minimized using a simulated annealing method, or other comparable optimization technique. As a result of the optimization, an optimized grouping is generated, and available to the user for inspection. If the optimized grouping is acceptable to the user, MBIST logic and related circuitry are inserted into the integrated circuit design according to the optimized grouping at step 310. If the user decides at decision point 308 that the output optimized grouping is not desirable, steps 302-308 may be repeated, and the user may select different weights at step 302, potentially resulting in a different optimized grouping of memory devices to MBIST controllers. Further details of the MBIST area, wiring length and timing calculations and optimization of steps 303-307 are described in connection with step 104 of FIG. 1 above.

In another embodiment, the schedule is optimized based upon the power consumption and test time, without optimization of the grouping of memory devices to MBIST controllers. Such embodiment is useful, for example, where a circuit designer wants to do MBIST insertion, but layout information for the circuit design is not yet available.

In another embodiment, estimation of a parameter may be performed for less than all of the factors if information concerning less than all of the factors is known. For example, the area overhead may be estimated from the word width of the memory devices, address size of the memory devices, and amount of sharing between the controller and memory device, even if the number and type of ports of the memory device are not known. As another example, the test run time may be estimated from the address size of the memory devices, the data width of the memory devices, the number of ports of the memory devices, the address size of the MBIST engine, and the clock frequency, even if the schedule/groupings used and the MBIST algorithms used are not known.

In another embodiment, optimization may be performed during the grouping optimization step if information concerning less than all of the parameters is known. For example, the area overhead and wiring congestion overhead may be optimized, even if the timing overhead is not known.

A compact model for estimating the power consumption during MBIST will now be described. The compact model may be used as part of the estimation of power consumption.

Power consumption during MBIST depends on many factors of the memories, including the address size of the memory, the data width of the memory, the memory's column multiplexer factor, the frequency at which the memory is being tested, the memory test algorithm utilized during MBIST, the number of memory devices shared by each MBIST controller, and the number of read or write ports of the memory.

In order to create a compact model, memories having varied factors are selected from various vendors, foundries, and technology nodes. Once a set of memories is selected, each memory of the memories under test is subjected to a flow for MBIST, wherein the power consumption may be calculated for that particular memory of the memories under test.

Figure 4:
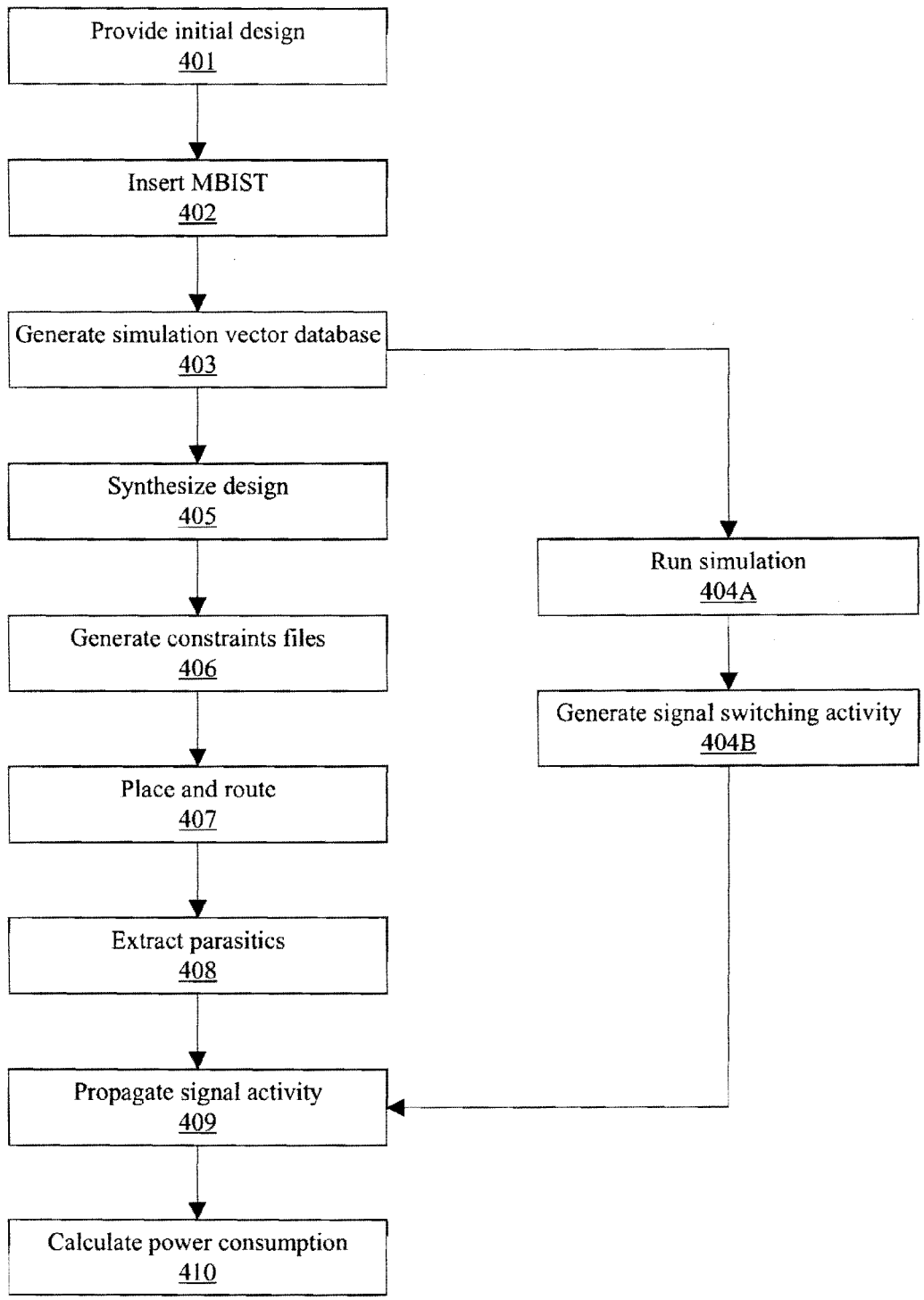
FIG. 4 illustrates an exemplary flow to generate experimental data for power consumption of memories during MBIST.

FIG. 4 illustrates a flow used to generate experimental data for power consumption of memories during MBIST according to an embodiment. The flow includes providing the initial design, including memories under test, at step 401. At step 402, the MBIST test logic and supporting circuitry are inserted into the initial design. At step 403, a database containing simulation vectors for a particular MBIST algorithm is generated. Such MBIST algorithms may include march LR, checkerboard, wordline stripe, galloping ones, pseudorandom address, port interaction, or other user-specific algorithms. Signal switching activity is generated by running simulation in steps 404A and 404B. At step 405, the design, including the inserted MBIST test logic and supporting circuitry, is synthesized. One or more files containing timing, power, and area constraints for the design are generated at step 406. At step 407, the design is placed and routed. During step 408, parasitic extraction is performed using sign-off constraints. During step 409, signal activity is propagated. Finally, the power consumption is calculated from the propagated signal activity at step 410. The full design flow is repeated for each of the memories from the set of memories under test.

The power consumption results may be stored in a database, and the relationship between the power consumption and the various factors observed. Based on the compiled database, a set of equation is created that model the average power consumption during MBIST for a memory design using a particular testing schedule. These equations allow the accurate estimation of the power consumption during MBIST for a particular memory design—either different memories, or memories of the set of memories under test—that follows a particular MBIST schedule, without the requirement that the full design flow is first used for the memory design. Thus, the estimated power may be used to optimize the MBIST power consumption by selecting desirable values for each of the factors affecting power consumption.

The model includes a set of relationships between the power consumption and the various factors, which are calculated from the compiled database:

1. The average power consumption $P_{avg}$ and address size of memory $f_1$ shows a linear relationship, whereby the average power consumption is proportional to the address size of the memory. The relationship can be modeled as $P_{avg} \propto f_1$.
2. The average power consumption and the data width (or size) of the memory $f_2$ shows a linear relationship, such that power consumption is proportional to the data width. The relationship can be modeled as $P_{avg} \propto f_2$.
3. Similarly, the average power consumption is proportional to the column multiplexing size $f_3$, exhibiting a linear relationship. The relationship can be modeled as $P_{avg} \propto f_3$.
4. The average power consumption is proportional to the frequency at which the memory is tested $f_4$. The relationship can be modeled as $P_{avg} \propto f_4$.
5. The average power consumption is proportional to the number of memory devices shared by each MBIST controller of the memory $f_5$, if the all of the memory devices are tested in parallel. The relationship can be modeled as $P_{avg} \propto f_5$. But, if the devices are tested in series, then the circuit design behaves as if a MBIST controller is not shared among a number of memory devices. The relationship can be modeled as k, where k is a value independent of the number of memory devices associated with a controller.
6. The average power consumption is proportional to the memory test algorithm applied during MBIST $f_6$. A test algorithm has a specific pattern set that is applied to a memory device under test, such that the average power consumption of a memory device is dependent upon the type of test algorithm being run. The relationship can be modeled as $P_{avg} \propto f_6$.

Having developed the relationships between the various factors and power consumption, a compact model may be developed that estimates the average power consumption during MBIST. The associated equation is $$P_{avg} = a^*(f_1) + b^*(f_2) + c^*(f_3) + d^*(f_4) + e^*(f_5) + g^*(f_6) + h$$

where a, b, c, d, e, g, and h are constants determined from the relationships between the average power and the various factors. Using the developed compact model, circuit designers may estimate the average power consumption prior to proceeding through the whole design flow separately, or as part of the flows described and illustrated in connection with FIGS. 1 and 2, saving design and development time, and thus reducing development cost.

A compact model for estimating the total area overhead for MBIST will now be described. The compact model is used as part of the estimation of area overhead, including comparator area overhead, controller area overhead, and multiplexer area overhead.

The area overhead required for MBIST depends on a number of factors. The most notable considered here include the word width of the memory devices, the memory devices' address size, the type of memory devices, whether a memory device has separate test ports, the number of memory devices that share common controllers, and the frequency at which the memory devices are tested. The type of memory devices includes such variations as port configuration type. For example a memory device may have a single port for both reading from and writing to memory. A memory device may also have a first port for reading from and a second port for writing to memory. Other port configurations are possible and taken into account by type of memory factor.

In order to create the area compact model, memories having varied factors may be selected from various vendors, foundries, and technology nodes. Each memory is then subjected to a design flow, wherein the total area overhead may be calculated for that particular memory.

Figure 5:
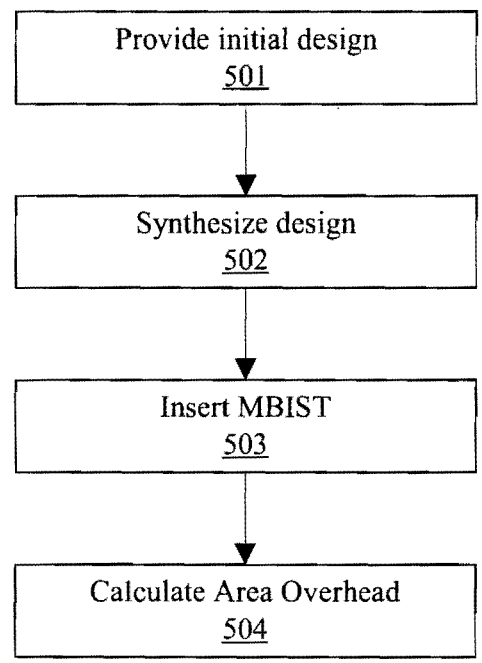
FIG. 5 illustrates an exemplary flow to generate experimental data for area overhead of memories during MBIST.

FIG. 5 illustrates an exemplary flow to generate experimental data for area overhead of memories during MBIST. At step 501, the initial design without MBIST is provided. At step 502, the design is synthesized. At step 503, the MBIST test logic and supporting circuitry are inserted into the synthesized design. The area overhead is then calculated for the MBIST hardware at step 504, including the area overhead for controllers, comparators, and multiplexers, for a particular grouping of memories under test. The full design flow is repeated, varying the various factors described above that affect area overhead.

The area overhead results may then by compiled into a database, and the relationship between the area overhead and the various factors observed. Based on the compiled database, sets of equations are created that model the total area overhead. The total area overhead is primarily attributable to the comparators, controllers, and multiplexers used in MBIST. As a result, the area overhead is considered separately for each contributor to the total area overhead, which then are considered together as part of the total area overhead model.

A set of relationships between the comparator area overhead and the various factors are calculated from the compiled database:

1. The comparator area overhead $A_{comparator}$ and memory data width variation $q_1$ shows a linear relationship, whereby the comparator area overhead is proportional to the memory data width variation. The relationship can be modeled as $A_{comparator} \propto q_1$.
2. The comparator area overhead $A_{comparator}$ and the number of memory devices shared by a controller $q_2$ shows a linear relationship, whereby the comparator area overhead is proportional to the number of memory devices shared by a controller, when comparators are not shared among memory devices because there exists one memory per comparator. The relationship can be modeled as $A_{comparator} \propto q_2$.
3. The comparator area overhead is proportional to the number of read ports of a memory device $q_3$, exhibiting a linear relationship. This relationship is linear because there exists one comparator per read memory read port. The relationship can be modeled as $A_{comparator} \propto q_3$.

Having developed the relationships between the various factors and the comparator area overhead, a compact model may be developed that estimates the comparator area overhead for MBIST. The associated equation is:

$$A_{comparator} = m^*(q_1) + n^*(q_2) + r^*(q_3) + s$$

where m, n, r, and s are constants determined from the relationships between the comparator area overhead and the various factors.

A set of relationships between the controller area overhead and the various factors are also calculated from the compiled database:

1. The controller area overhead $A_{controller}$ and the address size of the memory $q_4$ shows a linear relationship, whereby the controller area overhead is proportional to the address size. The relationship can be modeled as $A_{controller} \propto q_4$.
2. The controller area overhead $A_{controller}$ is proportional to the number of memory devices shared by a controller. The relationship can be modeled as $A_{controller} \propto q_5$.
3. The controller area overhead is proportional to the number of read ports of a memory device $q_6$, exhibiting a linear relationship. The relationship can be modeled as $A_{controller} \propto q_6$.

The associated equation is:

$$A_{controller} = t^*(q_4) + u^*(q_5) + v^*(q_6) + x$$

where t, u, v, and x are constants determined from the relationships between the controller area overhead and the various factors.

A set of relationships between the multiplexer area overhead and the various factors are also calculated from the compiled database:

1. The multiplexer area overhead $A_{mux}$ is proportional to the number of control pins $q_7$, where control pins are shared with functional pins. The relationship can be modeled as $A_{mux} \propto q_7$. But, if this condition is not met, then the relationship between the multiplexer area overhead and control pins is modeled as K, where K is a constant.

The associated equation is:

$$A_{mux} = y^*(q_7) + z$$

where y and z are constants determined from the relationships between the multiplexer area overhead and the various factors.

In addition to the above factors affecting area overhead, the area varies with each technology node. For example, the various area overheads will be different for a 130 nm technology process than a 90 nm technology process. The total MBIST area overhead equation takes this technology node dependence into account with a technology dependent constant j. Thus, the associated equation for the area overhead model is:

$$A_{MBIST} = j^*(A_{comparator} + A_{controller} + A_{mux})$$

This area overhead model allows circuit designers to estimate the area overhead due to MBIST prior to proceeding through the entire design flow, alone or as described and illustrated in connection with FIGS. 1 and 3, saving development time and cost. Additionally, estimating the area overhead due to comparators, controllers, and multiplexers aids the circuit designer who seeks to optimize the MBIST configuration, i.e. placement of controllers, comparators, and multiplexers, as well as associated wiring, to reduce wiring congestion and conform wiring to meet timing constraints.

Although various embodiments have been described with respect to specific examples and subsystems, it will be apparent to those of ordinary skill in the art that the concepts disclosed herein are not limited to these specific examples or subsystems but extends to other embodiments as well. For example, certain method or process steps have also been described, as having a particular sequence or order of steps, but this sequence or order of steps may be different in other embodiments. Included within the scope of these concepts are all of these other embodiments as specified in the claims that follow.

We claim:

1. A computer-implemented method of generating memory built-in-self-test (MBIST) circuitry to be disposed on an integrated circuit, comprising:
    (a) receiving an integrated circuit design that has a plurality of memory devices, wherein a plurality of memory factors are associated with each memory device;
    (b) selecting a weight for each grouping parameter of a plurality of grouping parameters associated with MBIST circuitry;
    (c) calculating an estimate for each grouping parameter of the plurality of grouping parameters using a compact model, wherein the compact model models a relationship between the plurality of grouping parameters and the plurality of memory factors, and wherein the compact model is formulated from test data of a plurality of test memory devices;
    (d) applying the weights to each estimated grouping parameter to create a cost function comprising a sum of weighted grouping parameters;

(e) minimizing the cost function using an optimization technique;
(f) generating an optimized grouping of MBIST circuitry based on the minimized cost function; and
(g) inserting MBIST circuitry into the integrated circuit design according to the optimized grouping to generate a modified integrated circuit design;
wherein at least the receiving, calculating, applying, minimizing, and generating are implemented by a computer.

2. The computer-implemented method of claim 1, wherein one of the grouping parameters of the plurality of grouping parameters comprises an area overhead.

3. The computer-implemented method of claim 1, wherein one of the grouping parameters of the plurality of grouping parameters comprises a wiring congestion overhead.

4. The computer-implemented method of claim 1, wherein one of the grouping parameters of the plurality of grouping parameters comprises a timing overhead.

5. The computer-implemented method of claim 1, further comprising: repeating each of the steps (b) through (f), wherein a second weight is assigned to each grouping parameter of the plurality of grouping parameters, and wherein one or more second weights assigned to the grouping parameter of the plurality of grouping parameters are different from the weights previously assigned to the grouping parameter during step (b).

6. The computer-implemented method of claim 1, wherein steps (a) through (g) are performed in seriatim.

7. The computer-implemented method of claim 1, further comprising: normalizing each grouping parameter of the plurality of grouping parameters.

8. The computer-implemented method of claim 7, wherein normalizing each grouping parameter comprises linearly interpolating each grouping parameter to a scale of zero to one.

9. The computer-implemented method of claim 1, wherein the optimization technique comprises a simulated annealing method.

10. The computer-implemented method of claim 1, wherein the plurality of grouping factors comprise one or more of a MBIST controller count, a count of memory devices shared by each MBIST controller, a memory device address width, and a memory device data width.

11. A computer-implemented method of generating memory built-in-self-test (MBIST) circuitry to be disposed on an integrated circuit, comprising:
(a) receiving an integrated circuit design that has a plurality of memory devices, wherein a plurality of memory factors are associated with each memory device;
(b) selecting a weight for each grouping parameter of a plurality of grouping parameters associated with MBIST circuitry;
(c) retrieving from a database a set of test data for a plurality of test memory devices, wherein the test data includes a plurality of grouping parameter test values and a plurality of memory factor test values;
(d) formulating a compact model modeling the relationship between the plurality of grouping parameters and the plurality of memory factors based on the set of test data;
(e) calculating an estimate for each grouping parameter of the plurality of grouping parameters using the compact model;
(f) applying the weights to each estimated grouping parameter to create a cost function comprising a sum of weighted grouping parameters;
(g) minimizing the cost function using an optimization technique;
(h) generating an optimized grouping of MBIST circuitry based on the minimized cost function; and
(i) inserting MBIST circuitry into the integrated circuit design according to the optimized grouping to generate a modified integrated circuit design;
wherein at least the receiving, retrieving, formulating, calculating, applying, minimizing, and generating are implemented by a computer.

12. The computer-implemented method of claim 11, wherein the plurality of grouping parameters comprise an area overhead, a timing overhead, and a wiring congestion overhead.

13. The computer-implemented method of claim 11, further comprising: normalizing each grouping parameter of the plurality of grouping parameters.

14. The computer-implemented method of claim 13, wherein normalizing each grouping parameter comprises linearly interpolating each grouping parameter to a scale of zero to one.

15. The computer-implemented method of claim 11, wherein the optimization technique comprises a simulated annealing method.

16. The computer-implemented method of claim 11, wherein the plurality of grouping factors comprise one or more of a MBIST controller count, a count of memory devices shared by each MBIST controller, a memory device address width, and a memory device data width.

17. A computer-implemented method of generating a compact model of area overhead for memory built-in-self-test (MBIST), comprising:
receiving an integrated circuit design that has a plurality of memory devices, wherein a plurality of factors affecting an area overhead are associated with each memory device;
inserting MBIST circuitry for the plurality of memory devices into the integrated circuit design to generate a modified integrated circuit design, wherein a plurality of area parameters are associated with the MBIST circuitry, and wherein the plurality of area parameters depend on the plurality of factors affecting the area overhead;
calculating a value for each area parameter of the plurality of area parameters by varying the value of one or more factors of the plurality of factors;
storing the plurality of area parameter values and the plurality of factor values in a database in a computer memory; and
formulating a compact model that models a relationship between the area overhead and the plurality of factors from the plurality of area parameter values and the plurality of factor values;
wherein the method is implemented by a computer.

18. The computer-implemented method of claim 17, wherein the area parameters of the plurality of area parameters comprise a controller area overhead.

19. The computer-implemented method of claim 17, wherein one of the area parameters of the plurality of area parameters comprises a comparator area overhead.

20. The computer-implemented method of claim 17, wherein one of area parameters of the plurality of area parameters comprises a multiplexer area overhead.

21. The computer-implemented method of claim 17, wherein the plurality of factors comprise one or more of a MBIST controller count, a count of memory devices shared by each MBIST controller, a memory device address width, and a memory device data width.

22. The computer-implemented method of claim 17, wherein the compact model is a linear equation.

23. A computer-readable non-transitory storage medium having stored thereon a plurality of instructions, the plurality of instructions when executed by a computer, cause the computer to perform:
  (a) receiving an integrated circuit design having a plurality of memory devices, wherein a plurality of memory factors are associated with each memory device;
  (b) selecting a weight for each grouping parameter of a plurality of grouping parameters associated with MBIST circuitry;
  (c) calculating an estimate for each grouping parameter of the plurality of grouping parameters using a compact model, wherein the compact model models a relationship between the plurality of grouping parameters and the plurality of memory factors, and wherein the compact model is formulated from test data of a plurality of test memory devices;
  (d) applying the weights to each estimated grouping parameter to create a cost function comprising a sum of weighted grouping parameters;
  (e) minimizing the cost function using an optimization technique;
  (f) generating an optimized grouping of MBIST circuitry based on the minimized cost function; and
  (g) inserting MBIST circuitry into the integrated circuit design according to the optimized grouping.

24. The computer-readable non-transitory storage medium having stored thereon a plurality of instructions of claim 23, wherein one of the grouping parameters of the plurality of grouping parameters comprises an area overhead.

25. The computer-readable non-transitory storage medium having stored thereon a plurality of instructions of claim 23, wherein one of the grouping parameters of the plurality of grouping parameters comprises a wiring congestion overhead.

26. The computer-readable non-transitory storage medium having stored thereon a plurality of instructions of claim 23, wherein one of the grouping parameters of the plurality of grouping parameters comprises a timing overhead.

27. The computer-readable non-transitory storage medium having stored thereon a plurality of instructions of claim 23, the plurality of instructions when executed by a computer, cause the computer to further perform: repeating each of the steps (b) through (f), wherein a second weight is assigned to each grouping parameter of the plurality of grouping parameters, and wherein one or more second weights assigned to the grouping parameter of the plurality of grouping parameters are different from the weights previously assigned to the grouping parameter during step (b).

28. The computer-readable non-transitory storage medium having stored thereon a plurality of instructions of claim 23, wherein steps (a) through (g) are performed in seriatim.

29. The computer-readable non-transitory storage medium having stored thereon a plurality of instructions of claim 23, the plurality of instructions when executed by a computer, cause the computer to further perform: normalizing each grouping parameter of the plurality of grouping parameters.

30. The computer-readable non-transitory storage medium having stored thereon a plurality of instructions of claim 29, wherein normalizing each grouping parameter comprises linearly interpolating each grouping parameter to a scale of zero to one.

31. The computer-readable non-transitory storage medium having stored thereon a plurality of instructions of claim 23, wherein the optimization technique comprises a simulated annealing method.

32. The computer-readable non-transitory storage medium having stored thereon a plurality of instructions of claim 23, wherein the plurality of grouping factors comprise one or more of a MBIST controller count, a count of memory devices shared by each MBIST controller, a memory device address width, and a memory device data width.

33. A computer-readable non-transitory storage medium having stored thereon a plurality of instructions, the plurality of instructions when executed by a computer, cause the computer to perform:
  (a) receiving an integrated circuit design having a plurality of memory devices, wherein a plurality of memory factors are associated with each memory device;
  (b) selecting a weight for each grouping parameter of a plurality of grouping parameters associated with MBIST circuitry;
  (c) retrieving from a database a set of test data for a plurality of test memory devices, wherein the test data includes a plurality of grouping parameter test values and a plurality of memory factor test values;
  (d) formulating a compact model modeling the relationship between the plurality of grouping parameters and the plurality of memory factors based on the set of test data;
  (e) calculating an estimate for each grouping parameter of the plurality of grouping parameters using the compact model;
  (f) applying the weights to each estimated grouping parameter to create a cost function comprising a sum of weighted grouping parameters;
  (g) minimizing the cost function using an optimization technique;
  (h) generating an optimized grouping of MBIST circuitry based on the minimized cost function; and
  (i) inserting MBIST circuitry into the integrated circuit design according to the optimized grouping.

34. The computer-readable non-transitory storage medium having stored thereon a plurality of instructions of claim 33, wherein the plurality of grouping parameters comprise an area overhead, a wiring congestion overhead, and a timing overhead.

35. The computer-readable non-transitory storage medium having stored thereon a plurality of instructions of claim 33, the plurality of instructions when executed by a computer, cause the computer to further perform: normalizing each grouping parameter of the plurality of grouping parameters.

36. The computer-readable non-transitory storage medium having stored thereon a plurality of instructions of claim 35, wherein normalizing each grouping parameter comprises linearly interpolating each grouping parameter to a scale of zero to one.

37. The computer-readable non-transitory storage medium having stored thereon a plurality of instructions of claim 33, wherein the optimization technique comprises a simulated annealing method.

38. The computer-readable non-transitory storage medium having stored thereon a plurality of instructions of claim 33, wherein the plurality of grouping factors comprise one or more of a MBIST controller count, a count of memory devices shared by each MBIST controller, a memory device address width, and a memory device data width.

39. A computer-readable non-transitory storage medium having stored thereon a plurality of instructions, the plurality of instructions when executed by a computer, cause the computer to perform:
- receiving an integrated circuit design having a plurality of memory devices, wherein a plurality of factors affecting an area overhead are associated with each memory device;
- inserting MBIST circuitry for the plurality of memory devices into the integrated circuit design, wherein a plurality of area parameters are associated with the MBIST circuitry, and wherein the plurality of area parameters depend on the plurality of factors affecting the area overhead;
- calculating a value for each area parameter of the plurality of area parameters by varying the value of one or more factors of the plurality of factors;
- storing the plurality of area parameter values and the plurality of factor values in a database in a computer memory; and
- formulating a compact model modeling a relationship between the area overhead and the plurality of factors from the plurality of area parameter values and the plurality of factor values.

40. The computer-readable non-transitory storage medium having stored thereon a plurality of instructions of claim 39, wherein one of the area parameters of the plurality of area parameters comprises a controller area overhead.

41. The computer-readable non-transitory storage medium having stored thereon a plurality of instructions of claim 39, wherein one of the area parameters of the plurality of area parameters comprises a comparator area overhead.

42. The computer-readable non-transitory storage medium having stored thereon a plurality of instructions of claim 39, wherein one of the area parameters of the plurality of area parameters comprises a multiplexer area overhead.

43. The computer-readable non-transitory storage medium having stored thereon a plurality of instructions of claim 39, wherein the plurality of factors comprise one or more of a MBIST controller count, a count of memory devices shared by each MBIST controller, a memory device address width, and a memory device data width.

44. The computer-readable non-transitory storage medium having stored thereon a plurality of instructions of claim 39, wherein the compact model is a linear equation.

* * * * *

UNITED STATES PATENT AND TRADEMARK OFFICE
CERTIFICATE OF CORRECTION

PATENT NO.      : 8,719,761 B2                                Page 1 of 1
APPLICATION NO. : 13/625682
DATED           : May 6, 2014
INVENTOR(S)     : Norman Card et al.

It is certified that error appears in the above-identified patent and that said Letters Patent is hereby corrected as shown below:

Title Page, item (73) Assignee should read: Cadence Design Systems, Inc.

Signed and Sealed this
Eleventh Day of November, 2014

Michelle K. Lee
*Deputy Director of the United States Patent and Trademark Office*